US006466446B1

(12) United States Patent
Nagy et al.

(10) Patent No.: US 6,466,446 B1
(45) Date of Patent: Oct. 15, 2002

(54) INTEGRATED CIRCUIT PACKAGE WITH DIAMOND HEAT SINK

(75) Inventors: Bela Nagy, Acton, MA (US); Arjun Partha, Hudson, MA (US)

(73) Assignee: Saint Gobain/Norton Industrial Ceramics Corporation, Worcester, MA (US)

( * ) Notice: Subject to any disclaimer, the term of this patent is extended or adjusted under 35 U.S.C. 154(b) by 0 days.

(21) Appl. No.: 08/269,706

(22) Filed: Jul. 1, 1994

(51) Int. Cl.[7] .................................................. H05K 7/20
(52) U.S. Cl. ........................ 361/708; 257/675; 361/723
(58) Field of Search ............................... 165/80.2, 80.3, 165/185, 104.33; 174/16.3, 252; 257/705–707, 712, 713, 668, 675; 361/704–709, 713, 717–718, 719–720, 723, 813; 428/209, 908; 437/209, 215, 221, 224, 902

(56) References Cited

U.S. PATENT DOCUMENTS

| | | | | |
|---|---|---|---|---|
| 4,680,613 A | * | 7/1987 | Daniels et al. | 257/675 |
| 4,764,804 A | * | 8/1988 | Sahara et al. | 174/16.3 |
| 5,008,737 A | | 4/1991 | Burnham et al. | 357/81 |
| 5,146,314 A | * | 9/1992 | Pankove | 165/104.33 |
| 5,293,509 A | | 3/1994 | Yamakawa et al. | 257/705 |
| 5,365,409 A | | 11/1994 | Kwon et al. | 361/813 |
| 5,379,187 A | * | 1/1995 | Lee et al. | 361/813 |

FOREIGN PATENT DOCUMENTS

| | | |
|---|---|---|
| DE | 4021871 A1 | 1/1992 |
| EP | 0 164 794 A2 | 12/1985 |
| EP | 0 273 556 A1 | 7/1988 |
| EP | 0 484 297 A2 | 5/1992 |
| EP | 515094 | 11/1992 |
| EP | 0 538 798 A1 | 4/1993 |
| JP | 3227535 | 10/1991 |
| JP | 5160304 | 6/1993 |
| JP | 5251609 | 9/1993 |
| JP | 6291217 | 10/1994 |

OTHER PUBLICATIONS

Research Disclosure, "Electrical Resistive, Thermally Conductive Diamond Coating For Integrated Circuit Chips", 4/88, No. 288, Kenneth Masch Publications Ltd, England, (361/713).*
Masato Tanaka, Yukiharu Takeuchi, Advanced Package Development, SHINKO Electric Industries Co., Ltd., 80, Oshimada–machi, Nagano City, 381–22 Japan, *Thermal Analysis of Plastic QFP With High Thermal Dissipation*, 1992 IEEE, pp. 332–339.

* cited by examiner

*Primary Examiner*—Gregory Thompson
(74) *Attorney, Agent, or Firm*—David P. Gordon; David S. Jacobson; Thomas A. Gallagher

(57) ABSTRACT

An IC package includes a high thermal conductivity insulating material substrate, such as polycrystalline diamond, on which the IC is mounted for thermal management. The electrical lead pins of the package are electrically connected to the IC and thermally connected to the substrate.

32 Claims, 2 Drawing Sheets

INTEGRATED CIRCUIT PACKAGE WITH DIAMOND HEAT SINK

BACKGROUND OF THE INVENTION

The ever-increasing demand for smaller, higher performance information systems has lead to the adoption of the integrated circuit ("IC") as the information processing center of the modern computer. These integrated circuits, or chips, are typically housed within standard ceramic, plastic or metal packages and carry information between the chip and other information processing units within the system.

In one type of plastic encapsulated dual in-line package, such as the package 1 shown in FIG. 1, an integrated circuit chip 2 having a plurality of wire bonding pads 3 at its perimeter is fastened to a die substrate 4 which is held by two tie bars 5 embedded in thermoplastic molding compound 6, such as a polyimide. A plurality of metal legs, or leads 7 are also embedded in the plastic compound 6 with (typically) nickel-plated wire bonding pads 8 at their inner ends. The leads 7 and substrate 4 are parts which have been separated from a lead frame in the course of assembly of the package 1. Lead wires 9 are bonded to the pads 3 and the bonding pads 8 of the leads 7 to connect the chip 2 to the leads 7, which provide electrical connection means to other circuit components.

Because electrical inefficiencies in the chip generate heat, the temperature of both the chip 2 and other parts of the package supporting the chip 2 significantly rise during use. It is known that such elevated temperatures can degrade the IC's performance. For example, because many of the IC's critical processes rely on electron kinetic phenomena which become accelerated by increased temperature, failures in metallization and bonded interfaces occur during extended use. Accordingly, heat production by the chip, often termed "thermal density", has become a significant design consideration which threatens to limit the further miniaturization of information systems within reasonable cost constraints.

Conventional treatment of the thermal density problem has met with limited success. For example, in the prior art design shown in FIG. 1, heat generated by the chip is dissipated through the plastic molding, the die pads and the bonding wires connecting the chip and the legs of the lead frame. However, each of these thermal conduits is only marginally effective. In particular, the wires are poor thermal conduits because they have a small cross section (i.e., about 0.002 inch thickness). The die pads, while having a good cross section (i.e., about 0.010 inch thickness) are ineffective thermal conduits because they are truncated at each end of the IC package, and so there are no metal thermal paths available to the outside after the IC molding process. The plastic molding has an extremely low thermal conductivity. One present improvement in thermal dissipation connects a more thermally conductive, high surface area material (known as a "heat spreader") to the chip. Although embedded heat spreaders succeed in dissipating hot spots on the chip, they do not significantly assist in removing heat from the package as a whole. Another present improvement involves blowing air across either the chip or attached heat spreader, thereby removing heat convectively from the package. Although this improvement succeeds in removing more heat from the package, it adds cost and requires geometry changes in the area around the package.

Therefore, it is the object of the present invention to provide a package which can provide electrical connection between the chip and the lead frame, yet still maintain the chip at low temperatures.

SUMMARY OF THE INVENTION

In accordance with the present invention, there is provided a plastic encapsulated integrated circuit package comprising:
   a) a thermally conductive, electrically insulating resistive base,
   b) an integrated circuit mounted on the base,
   c) a plurality of legs in electrical connection with the integrated circuit, and wherein the base is in intimate thermal contact with both the integrated circuit and the plurality of legs of the lead frame.

Also in accordance with the present invention, there is provided an integrated circuit package comprising:
   a) an integrated circuit,
   b) a lead frame having a plurality of legs in electrical connection with the integrated circuit, and
   c) a diamond film base, wherein the diamond film base is in intimate thermal contact with both the integrated circuit and the plurality of legs of the lead frame.

DETAILED DESCRIPTION OF THE INVENTION

It has been found that mounting a conventional chip on a thermally conductive, electrically insulating resistive substrate (such as diamond film) and providing intimate thermal contact of it with leads allows each of the leads to be used as a direct conduit for thermal dissipation. Because these leads have thicknesses of about 0.010 inches, they possess a much greater cross-section than the conventional wires, and are therefore more thermally conductive than the plastic encapsulent, the present invention provides for increased heat dissipation from the entire package yet does not interfere with its electrical properties.

For the purposes of the present invention, "intimate thermal contact" means that the thermal conductivity of the interface connecting the IC die pad to the lead exceeds 2 W/cm K, so that there is essentially no thermal resistance provided by any gap therebetween. Preferably, the base touches both the leads and the chip.

Any substrate having a thermal conductivity of at least about 2 W/cm K and an electrical resisitivity of at least about 106 ohm-cm at 10 V dc can be used as the thermally conductive, electrically resisitive base of the present invention. These substrates include, but are not limited to, diamond, aluminum nitride, beryllia, diamond-coated substrates, and insulator-clad metals. Preferably, the thermal conductivity of the base is at least about 6 W/cm K, more preferably at least about 10 W/cm K. Preferably, the electrical resisitivity of the base is at least about 108 ohm-cm, more preferably exceeds $10^{10}$ ohm-cm. The thickness of the base may be between about 100 and about 500 um, preferably between about 150 and 200 um.

Most preferably, the base is diamond film because it is both an excellent thermal conductor and an excellent electrical insulator. Such diamond film can be any high thermal conductivity diamond (free standing or coating). In some embodiments, the base is a diamond film having a thermal conductivity of at least about 10 W/cm K and an electrical resisitivity of at least about $10^{10}$ ohm-cm. Typically, the diamond film is chemically vapor deposited (CVD) diamond which has a thickness of between about 150 and about 200 microns. Because the diamond film can be so thin, its utilization in the present invention offers a design advantage in that it can be incorporated into conventional system designs without a significant change in the package geometry.

Figure 1:
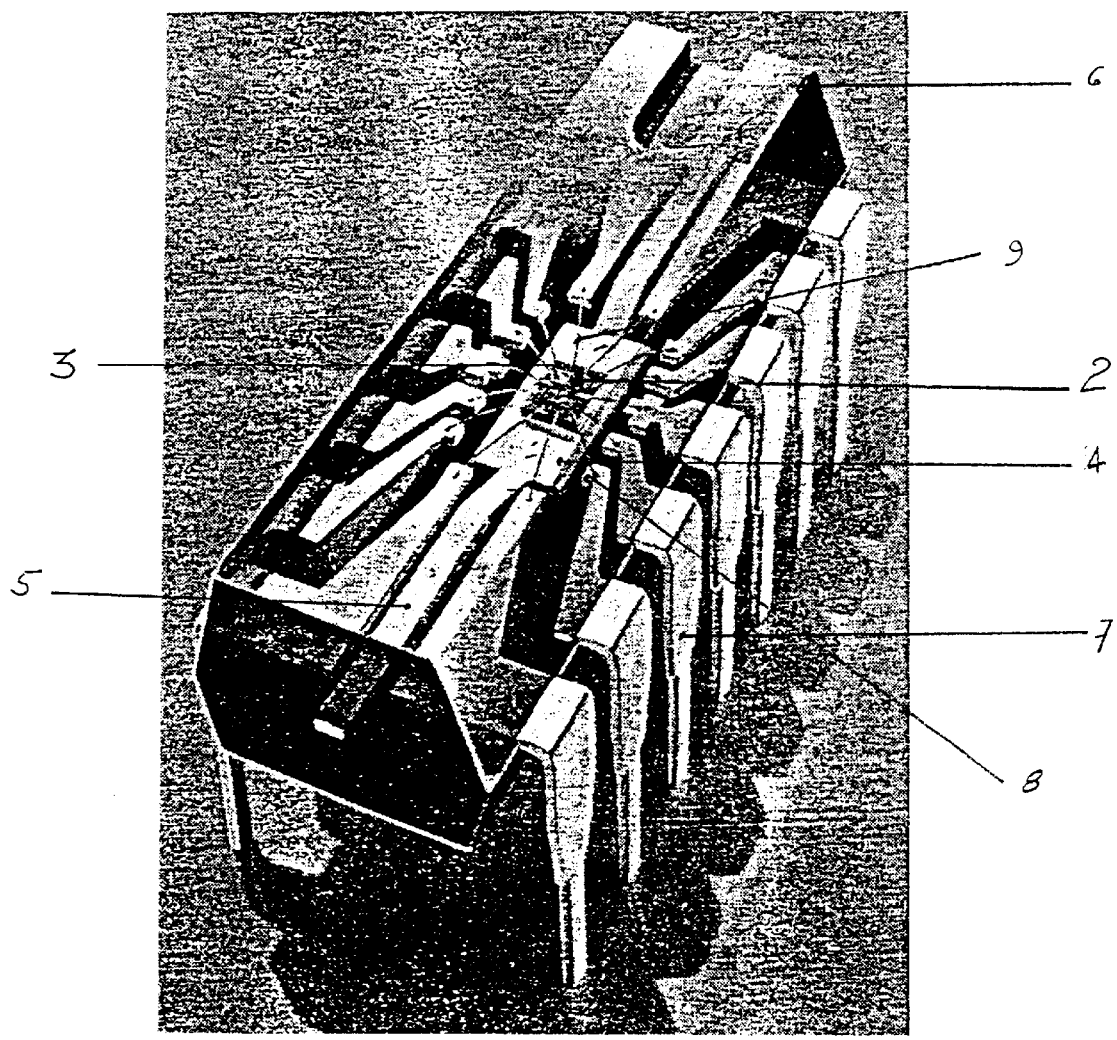
FIG. 1 is an elevated perspective view of a conventional dual in-line integrated circuit package (DIP).
Figure 2:
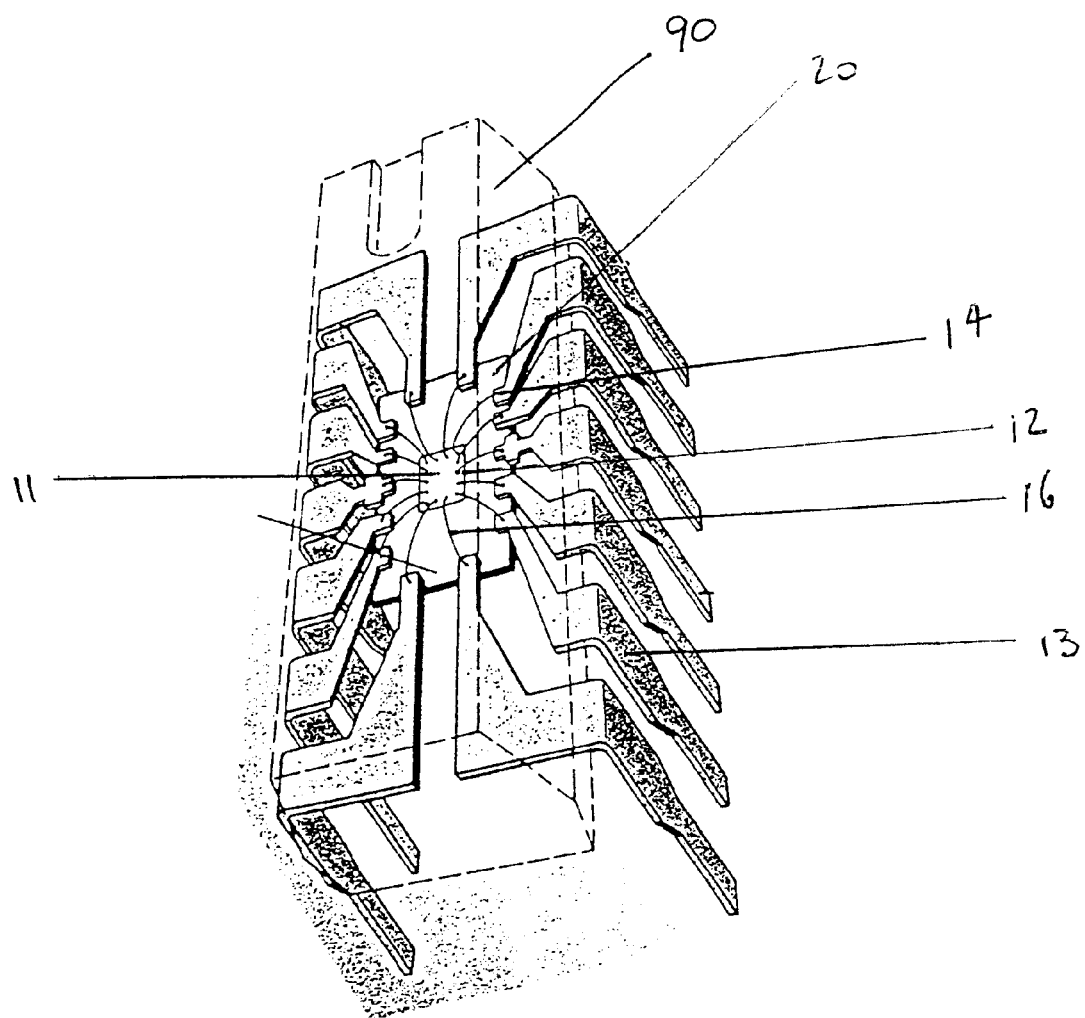
FIG. 2 is an elevated perspective view of the present invention.

In one embodiment of the present invention, as shown in FIG. 2, there is provided a plastic encapsulated package comprising a chip 11 having die pads 12 which is mounted upon a diamond substrate 20. Leads or legs 13 having leg connection bonding pads 14 are not only placed in electrical connection with chip 11 via wires 16, they are also placed in intimate thermal contact with diamond film 20 by virtue of their abutment thereto. The entire package is encapsulated in plastic molding 90, save one end of each leg. Because diamond film is an excellent electrical insulator, its presence does not effect the transmission of information between chip 11 and legs 13. Because diamond film is also an excellent thermal conductor, heat generated within chip 11 flows through the diamond film and into each of the eight legs 13 and subsequently out of the package 99. In contrast to the prior art design shown in FIG. 1, wherein heat generated by the chip is dissipated directly (and poorly) only through thin wires and through the plastic molding, the present invention allows heat from the substrate to be dissipated not only through the thin wires and plastic molding but also directly through each of the wide leads 13. Because the present invention presents many more avenues for heat dissipation than the conventional design, it will dissipate heat much faster. Thermal analysis of the legs and encapsulant reveals that the copper leads have a thermal conductivity of about 228 BTU/(hr ft F) while the IC molding encapsulant polyamide has a thermal conductivity of only about 0.19 BTU/(hr ft F). Since the thermal conductivity of the legs are about 1000 times superior to that of the encapsulant, it is contemplated that the advantage of the present invention increases essentially directly with the number of legs in the package.

In one embodiment of the present invention containing 24 legs, finite element analysis revealed that the Tja (i.e., the temperature differential between the device junction and the ambient temperature) was only about 60 degrees C. In contrast, the Tja for a comparable conventional IC package was about 400 C. for the same power input.

The method by which the diamond film is attached to the chip can be any conventional attachment means, including soldering, clamping, bonding agents, and silver loaded epoxies. Similarly, the method by which the diamond film is attached to the legs of the package can be any conventional attachment means, including clamping, soldering, bonding agents, silver loaded epoxies, and brazing.

Any conventional chip and lead frame design can be used with the present invention as long as the design allows for a diamond film to be in intimate thermal contact with both the chip and the legs of the lead frame. Conventional chips include integrated circuits and discrete active devices such as transistors and diodes. Conventional package designs include both plastic and ceramic DIP, SIP, PGA, QFP, BGA and LCC designs. When a thermally conductive, electrically resistive substrate other than diamond is also used for a die pad, the IC package of the present invention is plastic encapsulated.

Because the thermally conductive, electrically resistive base of the present invention provides for greater heat dissipation, the IC packages of the present invention can tolerate larger amounts of power than the standard package without exceeding the critical device junction temperature. In particular, the present invention provides an improved JEDEC package capable of dissipating up to at least about 600% more power than the standard JEDEC package in forced air with a convection coefficient of about 50 W/m2 C. at 50 C. while still maintaining a maximum junction temperature of 125 C. In one embodiment, finite element analysis revealed that a 24 pin DIP of the present invention was capable of dissipating about 12 watts of power in forced air with a convection coefficient of about 50 W/m2 C. at 50 C. while still maintaining a maximum junction temperature of 125 C. In contrast, the standard JEDEC 24 pin DIP could dissipate only 1.6 watts.

We claim:

1. A plastic encapsulated integrated circuit package comprising:
   a) a thermally conductive, electrically insulating base,
   b) an integrated circuit mounted on the base, and
   c) a plurality of electrically conductive legs in electrical connection with the integrated circuit and extending outside the package,
wherein the base is in intimate contact with both the integrated circuit and the plurality of legs.

2. The package of claim 1 wherein the base has a thermal conductivity of at least 6 W/cm K.

3. The package of claim 2 wherein the base has a thermal conductivity of at least 10 W/cm K.

4. The package of claim 3 wherein the base has an electrical resistivity of at least 18 E8 ohm cm.

5. The package of claim 4 wherein the base has an electrical resistivity of at least 10 E10 ohm cm.

6. The package of claim 5 wherein the base has a thickness of between 100 and 500 $\mu$m.

7. The package of claim 6 wherein the base has a thickness of between 150 and 200 $\mu$m.

8. The package of claim 7 wherein the base is of a material selected from the group consisting of diamond, aluminum nitride, beryllia, diamond-coated substrates, and insulator clad metals.

9. The package of claim 8 wherein the base is CVD diamond.

10. The package of claim 9 wherein the diamond has a thickness of between 150 and 200 microns.

11. The package of claim 10 wherein the package has a design selected from the group consisting of the SIP, DIP, LCC, QFP, and PGA designs.

12. The package of claim 11 capable of dissipating 2 watts of energy in forced air with a convection coefficient of about 50 W/($m^2$ degrees C.) at 50 degrees C. while maintaining a maximum junction temperature of 125 degrees C.

13. The package of claim 11 capable of dissipating 5 watts of energy in forced air with a convection coefficient of about 50 W/($m^2$ degrees C.) at 50 degrees C. while maintaining a maximum junction temperature of 125 degrees C.

14. The package of claim 11 capable of dissipating 8 watts of energy in forced air with a convection coefficient of about 50 W/($m^2$ degrees C.) at 50 degrees C. while maintaining a maximum junction temperature of 125 degrees C.

15. The package of claim 11 capable of dissipating 10 watts of energy in forced air with a convection coefficient of about 50 W/($m^2$ degrees C.) at 50 degrees C. while maintaining a maximum junction temperature of 125 degrees C.

16. The package of claim 11 capable of dissipating 12 watts of energy in forced air with a convection coefficient of about 50 W/($m^2$ degrees C.) at 50 degrees C. while maintaining a maximum junction temperature of 125 degrees C.

17. An integrated circuit package comprising:
a) an integrated circuit,
b) a lead frame having a plurality of electrically conductive legs in electrical connection with the integrated circuit and extending outside of the package, and
c) a diamond film base,
wherein the diamond film base is in intimate thermal contact with both the integrated circuit and the plurality of legs of the lead frame.

18. The package of claim 17 wherein the base has a thermal conductivity of at least 6 W/cm K.

19. The package of claim 18 wherein the base has a thermal conductivity of at least 10 W/cm K.

20. The package of claim 19 wherein the base has an electrical resistivity of at least 18 E8 ohm cm.

21. The package of claim 20 wherein the base has an electrical resistivity of at least 10 E10 ohm cm.

22. The package of claim 21 wherein the base has a thickness of between 100 and 500 μm.

23. The package of claim 22 wherein the base has a thickness of between 150 and 200 μm.

24. The package of claim 23 wherein the package has a design selected from the group consisting of the SIP, DIP, LCC, QFP, and PGA designs.

25. The package of claim 24 wherein the package has a DIP design.

26. The package of claim 25 capable of dissipating 2 watts of energy in forced air with a convection coefficient of about 50 W/m$^2$ degrees C.) at 50 degrees C. while maintaining a maximum junction temperature of 125 degrees C.

27. The package of claim 26 capable of dissipating 5 watts of energy in forced air with a convection coefficient of about 50 W/(m$^2$ degrees C.) at 50 degrees C. while maintaining a maximum junction temperature of 125 degrees C.

28. The package of claim 27 capable of dissipating 8 watts of energy in forced air with a convection coefficient of about 50 W/(m$^2$ degrees C.) at 50 decrees C. while maintaining a maximum junction temperature of 125 degrees C.

29. The package of claim 28 capable of dissipating 10 watts of energy in forced air with a convection coefficient of about 50 W/(m$^2$ degrees C.) at 50 degrees C. while maintaining a maximum junction temperature of 125 degrees C.

30. The package of claim 29 capable of dissipating 12 watts of energy in forced air with a convection coefficient of about 50 W/(m$^2$ degrees C.) at 50 degrees C. while maintaining a maximum junction temperature of 125 degrees C.

31. The package of claim 26 wherein the package is encapsulated in plastic.

32. The package of claim 26 wherein the package is encapsulated in ceramic.

* * * * *